US009425792B2

(12) United States Patent
Govindaraj et al.

(10) Patent No.: US 9,425,792 B2
(45) Date of Patent: Aug. 23, 2016

(54) RECONFIGURABLE POWER SWITCH CHAINS FOR EFFICIENT DYNAMIC POWER SAVING

(71) Applicant: Texas Instruments Incorporated, Dallas, TX (US)

(72) Inventors: Sureshkumar Govindaraj, Irving, TX (US); Jose L. Flores, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 56 days.

(21) Appl. No.: 14/445,980

(22) Filed: Jul. 29, 2014

(65) Prior Publication Data

US 2015/0028943 A1 Jan. 29, 2015

Related U.S. Application Data

(60) Provisional application No. 61/859,381, filed on Jul. 29, 2013.

(51) Int. Cl.
| | |
|---|---|
| G05F 1/10 | (2006.01) |
| G05F 3/02 | (2006.01) |
| H03K 19/00 | (2006.01) |
| G06F 1/26 | (2006.01) |
| H03K 17/16 | (2006.01) |
| G06F 1/32 | (2006.01) |

(52) U.S. Cl.
CPC .............. *H03K 19/0016* (2013.01); *G06F 1/26* (2013.01); *G06F 1/3287* (2013.01); *H03K 17/164* (2013.01)

(58) Field of Classification Search
CPC ..... H03K 19/0016; G06F 1/3203; G06F 1/32; G06F 1/3296; G11C 5/147
USPC ........................................ 327/544; 326/33–34
See application file for complete search history.

(56) References Cited

U.S. PATENT DOCUMENTS

| | | | | |
|---|---|---|---|---|
| 8,421,499 | B2 * | 4/2013 | Takayanagi et al. | 326/33 |
| 8,736,314 | B2 * | 5/2014 | Kim | 327/108 |
| 8,786,309 | B2 * | 7/2014 | Takayanagi et al. | 326/33 |
| 2009/0115256 | A1 * | 5/2009 | Flynn et al. | 307/115 |

* cited by examiner

*Primary Examiner* — Quan Tra
(74) *Attorney, Agent, or Firm* — Robert D. Marshall, Jr.; Frank D. Cimino

(57) ABSTRACT

Traditionally, designs have been very conservative on power grid design using higher margins than those needed for safe operation. This is especially true for process driver designs which may not have enough data on process characteristics. This invention allows us to recoup these inefficiencies and to speed up the power up/power down dynamically. This invention sequences plural power supply switches serially or in plural parallel sets as set by a wake up mode.

1 Claim, 4 Drawing Sheets

RECONFIGURABLE POWER SWITCH CHAINS FOR EFFICIENT DYNAMIC POWER SAVING

CLAIM OF PRIORITY

This application claims priority under 35 U.S.C. 119(e)(1) to U.S. Provisional Application No. 61/859,381 filed Jul. 29, 2013.

TECHNICAL FIELD OF THE INVENTION

The technical field of this invention is power supply control in integrated circuits.

BACKGROUND OF THE INVENTION

Rapidly increasing power consumption in SOCs demand aggressive power saving techniques. Static power chain designs are overdesigned with excessive margins. This reduces the effectiveness of any dynamic power saving strategy.

Traditionally, designs have been very conservative on power grid design using higher margins than those needed for safe operation. This is especially true for process-driver designs which may not have enough data on process characteristics.

A traditional power chain design connects the power switches in a serial fashion. This restricts the power sequence duration to a single value. Usually this value is determined considering the worst case scenarios of maximum activity such as the maximum number of modules powering up/down together.

SUMMARY OF THE INVENTION

Traditionally, designs have been very conservative on power grid design using higher margins than those needed for safe operation. This is especially true for process driver designs which may not have enough data on process characteristics. This invention allows us to recoup these inefficiencies and to speed up the power up/power down dynamically.

This invention sequences plural power supply switches serially or in plural parallel sets as set by a wake up mode.

BRIEF DESCRIPTION OF THE DRAWINGS

These and other aspects of this invention are illustrated in the drawings, in which.

DETAILED DESCRIPTION OF PREFERRED EMBODIMENTS

The proposed solution provides a mechanism to reconfigure power switch chains dynamically. Each configuration has different delay and different current ramp characteristics during power sequencing. This provides flexibility to choose more efficient configurations based on the current state of the device.

Traditionally, designs have been very conservative on power grid design by using higher margins than those needed for safe operation. This is especially true for process-driver designs which may not have enough data on process characteristics. This invention allows us to recoup these inefficiencies and to speed up the power up/power down dynamically.

A traditional power chain design connects the power switches in a serial fashion. This restricts the power sequence duration to a single value. Usually this value is determined considering the worst case scenarios of maximum activity (maximum number of modules power up/down together).

Figure 1:
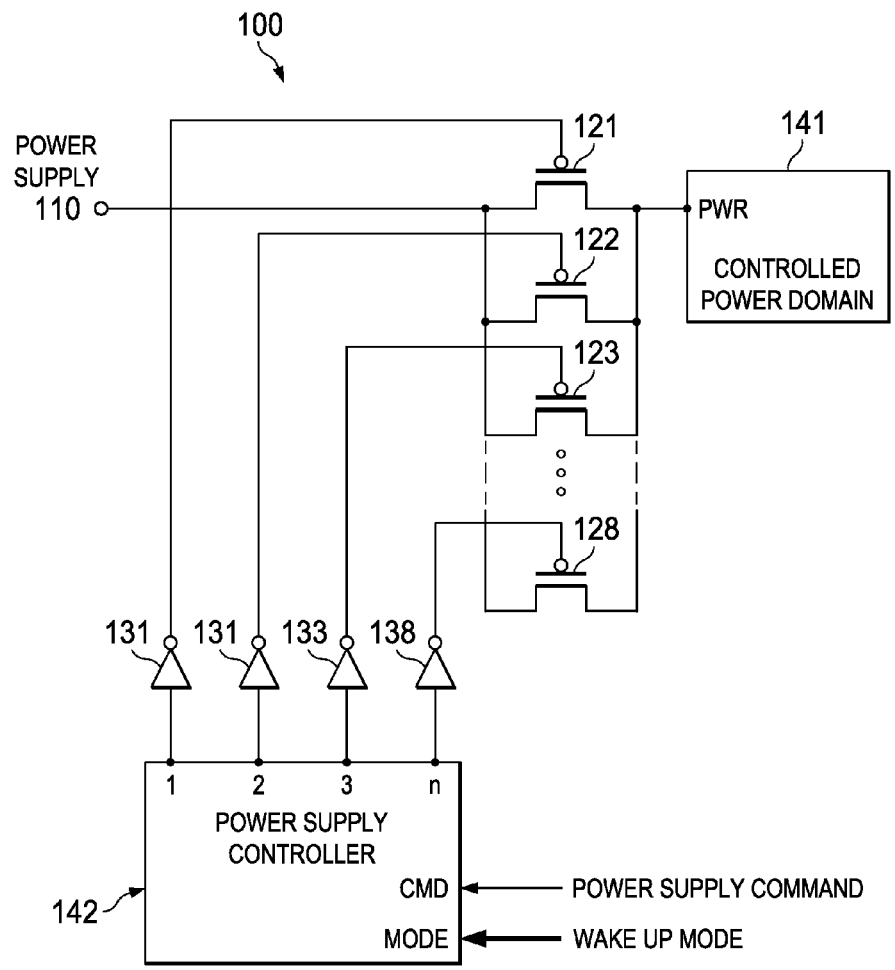
FIG. 1 illustrates the power control system of this invention.

FIG. 1 illustrates the power control system 100 used in this invention. Power supply 110 supplies power for various power domains in the integrated circuit including power domain 141. A set of power switches 121, 122, 123 . . . 128 couples power supply 110 to the power (PWR) input of power domain 141. Power supply controller 142 controls the conductive/non-conductive state of power switches 121, 122, 123 . . . 128. The input of each of power switches 121, 122, 123 . . . 128 is supplied with an individual signal from power supply controller 142. This invention controls the sequence of power switch activations.

FIG. 1 illustrates power supply controller receiving a power supply command and a wake up mode signal. The power supply command causes power supply controller to power up controlled power domain 141. The wake up mode signal determines the manner of power up in a manner more fully described below.

Figure 2:
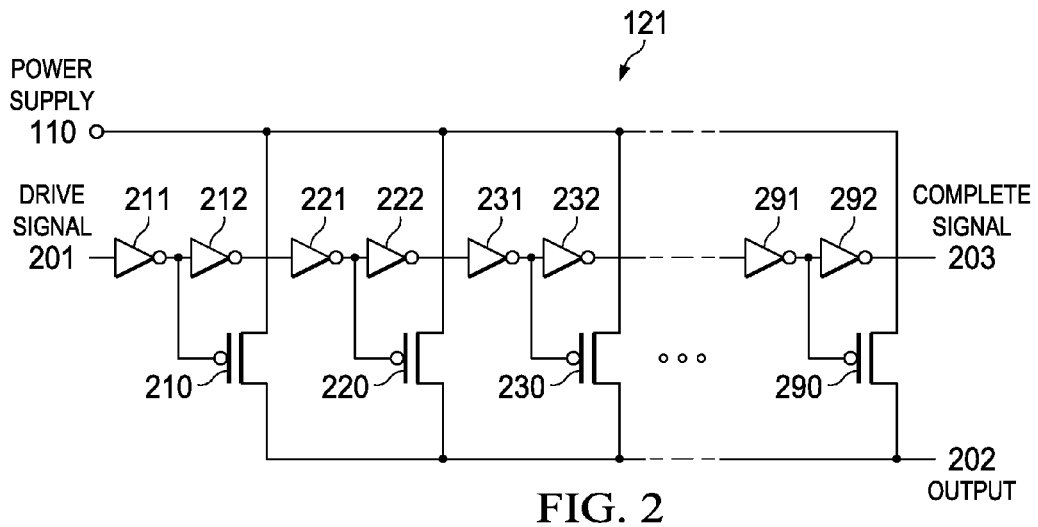
FIG. 2 illustrates the prior art manner of implementing power switches as chains of switching transistors triggered in a predetermined sequence with a predetermined delay.

FIG. 2 illustrates a prior art implementation of power switches 121, 122, 123 . . . 128 of FIG. 1. In the prior art these power switches are implemented by a serially triggered chain of transistors. In FIG. 2, Power Supply 110 connects to one terminal of the source-drain path of transistors 210, 220, 230 . . . 290. The other source-drain terminal of each transistor 210, 220, 230 . . . 290 connects to output 202 which connects to the power supply input of the controlled power domain 141. When driven to conduct each transistor 210, 220, 230 . . . 290 supplies power from power supply 110 to controlled power domain 141.

The transistors 210, 220, 230 . . . 290 are sequentially energized via an inverter chain. Drive signal 201 from a corresponding output of power supply controller 142 is input to inverter 211. The output of inverter 211 is connected to the gate of transistor 210 and to the input of inverter 212. The output of inverter 212 is connected to the input of inverter 221. The output of inverter 221 is connected to the gate of transistor 220 and to the input of inverter 222. The output of inverter 222 is connected to the input of inverter 231. The output of inverter 231 is connected to the gate of transistor 230 and to the input of inverter 232. The output of inverter 212 is connected to the input of a next inverter. This inverter chain continues to inverter 291. The output of inverter 291 is connected to the gate of transistor 290. The reason for providing inverter 292 and complete signal 203 is explained below.

An input from drive signal 201 causes inverter 211 to switch transistor 210 ON. Inverter 211 also switches inverter 212. This input causes inverter 212 to switch inverter 221. Inverter 221 switches transistor 220 ON. Each inverter in the chain causes a delay from its input before its output switches. This causes a propagation delay before the next transistor switches ON. Thus switches 210, 220, 230 . . . 290 switch ON sequentially as the input travels the inverter chain. The delay of each inverter in the chain depends upon the size of the transistors used in the inverter (bigger transistors switch faster) and the load on the output. Larger transistors 210, 220, 230 . . . 290 have larger gate capacitance requiring the corresponding driver to move more charge to turn the transistor ON. Thus larger transistors 210, 220, 230 . . . 290 cause the inverter chain to propagate slower than smaller transistors. Thus transistors 210, 220, 230 . . . 290 turn ON sequentially. When turning OFF a similar delay occurs in the inverter chain causing a corresponding sequential action in turning OFF transistors 210, 220, 230 . . . 290. This causes transistors 210, 220, 230 . . . 290 to turn OFF sequentially.

This example embodiment shows p-channel metal oxide semiconductor (PMOS) transistors controlling conduction of the voltage supply ($V_{dd}$) to the power domain. Those skilled in the art would realize this invention could be practiced using n-channel metal oxide semiconductor (NMOS) transistors to control conduction of ground ($V_{ss}$) to the power domain. Such a change would require inversion of the drive voltages (FIGS. 3 and 4) to control the NMOS transistors. Other aspects of such an NMOS circuit would operate as described here.

Figure 3:
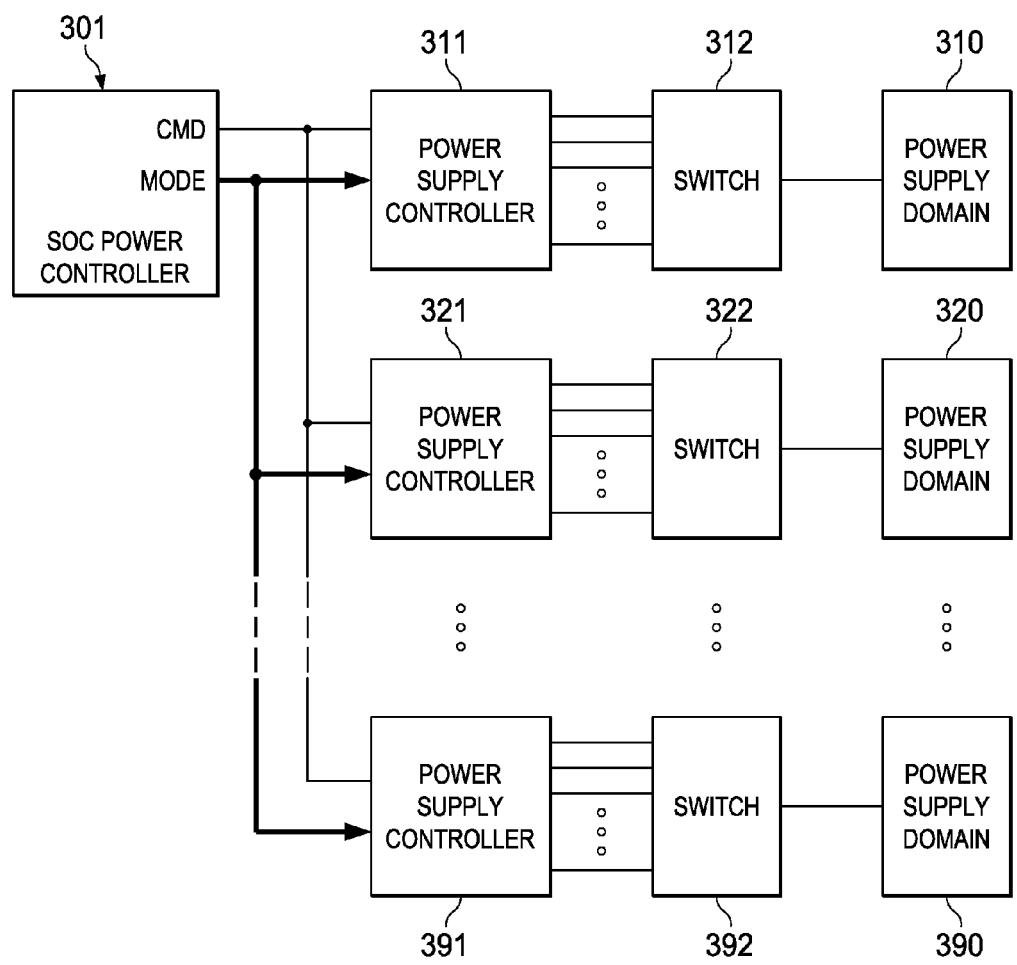
FIG. 3 illustrates a block diagram of a System on Chip (SOC) to which this invention is applicable.

FIG. 3 illustrates a block diagram of a System on Chip (SOC) to which this invention is applicable. The SOC includes plural power supply domains 310, 320 . . . 390. Each power supply domain 310, 320 . . . 390 has a corresponding power supply controller 311, 321 . . . 391 and a corresponding switch 312, 322 . . . 392. Each power supply controller 311, 321 . . . 391 corresponds to power supply controller 142 illustrated in FIG. 1. Each switch 312, 322 . . . 392 corresponds to switches 121, 122, 123 . . . 128 illustrated in FIG. 1. SOC power controller 301 sends a power supply command and a wake up mode signal to the power supply controllers 311, 321 . . . 391. SOC power controller 301 is thus able to control the power state of each of power supply domains 310, 320 . . . 390 via a power command and the manner of powering up (wake up) via the wake up mode.

Generally in real applications, the power management controller power cycles a very few modules at any particular time. Where there is low activity on a particular power grid, the integrated circuit could tolerate a more aggressive power sequence by turning on more switches. This invention lets the power management controller exploit such situations and power up/power down more switches using a semi-parallel/fully parallel power switch chain configuration. The current implementation supports four different configurations described below.

In the preferred embodiment the wakeup mode signal from SOC power controller 301 reconfigures the power chain to one of four configurations: all 8 chains connected in series; 2 parallel chains each with 4 chains in series; 4 parallel chains each with 2 chains in series; and all 8 chains in parallel. Based on the current activity level, the power management controller can choose to use any of these available configurations. Table 1 shows the coding of the 2-bit wake up mode signal.

TABLE 1

| Wake Up Mode[1:0] | Meaning |
| --- | --- |
| 0 0 | 8 power chains in series |
| 0 1 | 2 parallel sets of 4 power chains in series |
| 1 0 | 4 parallel sets of 2 power chains in series |
| 1 1 | 8 power chains in parallel |

Figure 4:
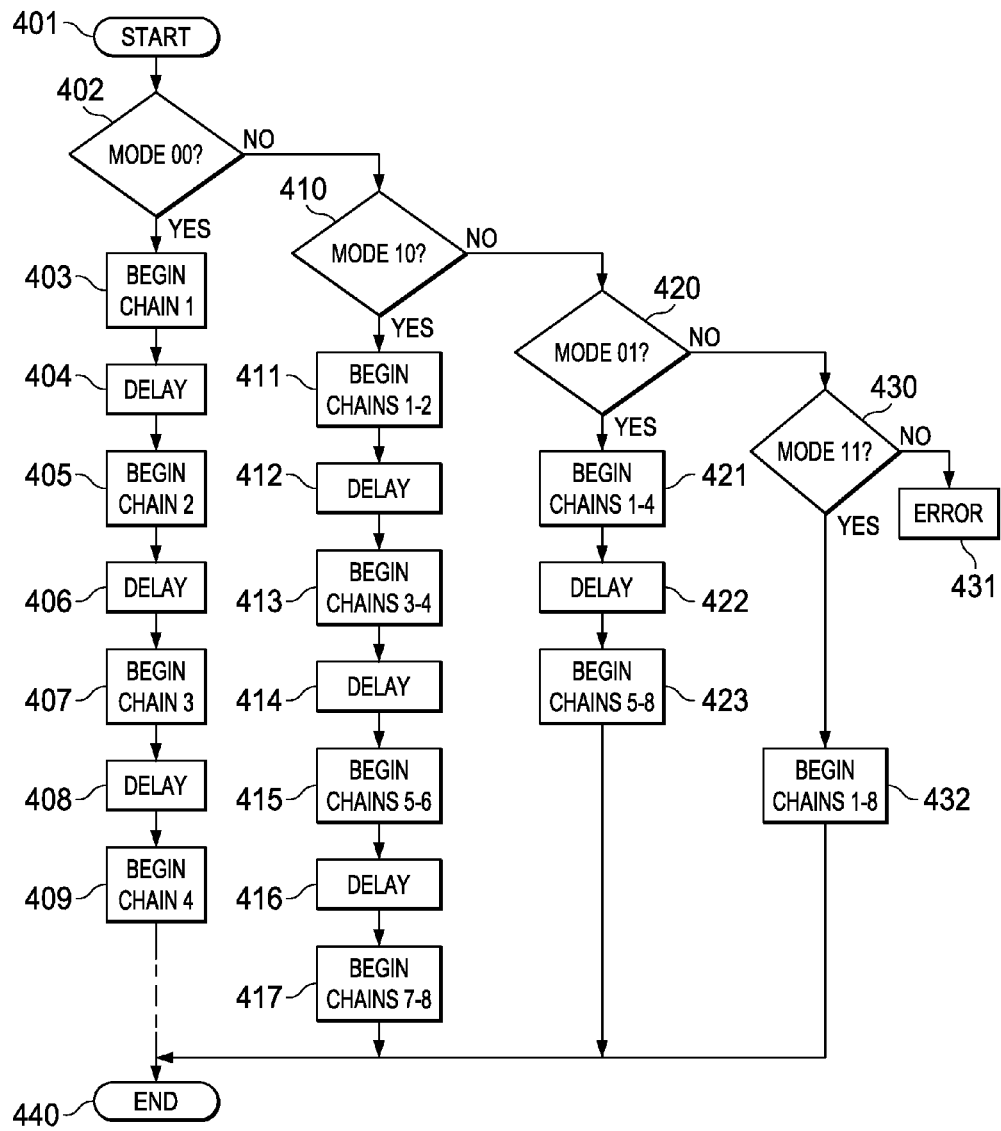
FIG. 4 is a flow chart indicating how each power supply controller performs power up based upon the wake up mode.

FIG. 4 is a flow chart indicating how each power supply controller 311, 321 . . . 391 performs power up based upon the wake up mode. The flow chart begins at start block upon receipt of a power up command from SOC power controller 301. Test block 402 determines if the wake up mode is [0:0]. If the wake up mode is [0:0] (Yes at test block 402), then block 403 begins power supply chain 1. This is accomplished by the corresponding power supply controller 311, 321 . . . 391 supplying the drive signal to turn ON power supply chain 1. Following delay 404 block 405 begins power supply chain 2. Following delay 406 block 407 begins power supply chain 3. Following delay 408 block 408 begins power supply chain 4. The process continues turning ON each power supply chain after a delay following turning ON the previous power supply chain. The process ends via end block 440 once all power supply chains are activated.

If the wake up mode is not [0:0] (No at test block 402), then test block 410 tests to determine if the mode is [1:0]. If the wake up mode is [1:0] (Yes at test block 410), then block 411 begins chains 1 and 2 simultaneously. This is accomplished by supply an ON command to both these chains. Following delay 412 block 413 begins power supply chains 3 and 4 simultaneously. Following delay 414 block 415 begins power supply chains 5 and 6 simultaneously. Following delay 416 block 417 begins power supply chains 8 and 8 simultaneously. At that point all power supply chains are on and the process ends via end block 440.

If the wake up mode is not [1:0] (No at test block 410), then test block 420 tests to determine if the mode is [0:1]. If the wake up mode is [0:1] (Yes at test block 420), then block 421 begins chains 1, 2, 3 and 4 simultaneously. This is accomplished by supply an ON command to these four chains. Following delay 422 block 423 begins power supply chains 5, 6, 7 and 8 simultaneously. At that point all power supply chains are ON and the process ends via end block 440.

If the wake up mode is not [0:1] (No at test block 420), then test block 430 tests to determine if the mode is [1:1]. If the wake up mode is not [1:1] (No at test block 430), then block 431 signals an error because the wake up mode is not identified. If the wake up mode is [1:1] (Yes at test block 430), then block 432 begins all chains 1, 2, 3, 4, 5, 6, 7 and simultaneously. This is accomplished by supply an ON command to these eight chains. At that point all power supply chains are ON and the process ends via end block 440.

Figure 5:
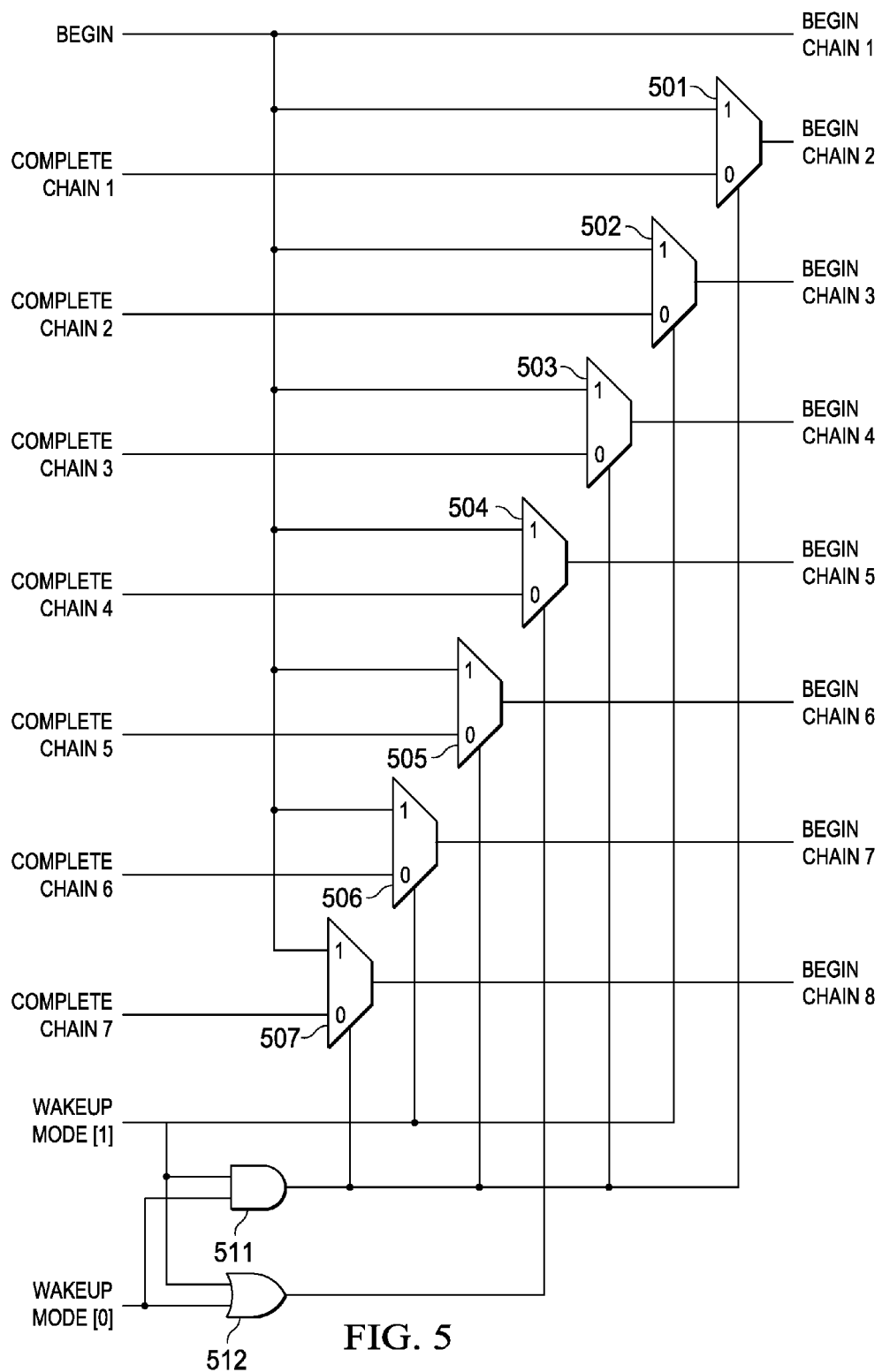
FIG. 5 illustrates a power controller circuit that uses the delay in the inverter chain to implement the delays illustrated in FIG. 4.

FIG. 5 illustrates a power controller circuit that uses the delay in the inverter chain (FIG. 2) to implement the delays 404, 406, 408, 412, 414, 416 and 422 illustrated in FIG. 4. Referring back to FIG. 2, inverter 292 is supplied by inverter 291 and generates a power on chain complete signal 203. The power on complete signal 201 indicates that all the transistors 210, 22, 230 . . . 290 of that chain have been turned ON. This power complete signal 201 is delayed relative to the begin chain signal by the delay of the inverter chain.

FIG. 5 illustrates a preferred embodiment of a power supply controller using the inverter chain delay. Multiplexer 501 has inputs from the begin signal and complete chain 1 and drives the begin chain 2. Multiplexer 502 has inputs from the begin signal and complete chain 2 and drives the begin chain 3. Multiplexer 503 has inputs from the begin signal and complete chain 1 and drives the begin chain 2. Multiplexer 504 has inputs from the begin signal and complete chain 4 and drives the begin chain 5. Multiplexer 505 has inputs from the begin signal and complete chain 5 and drives the begin chain 6. Multiplexer 506 has inputs from the begin signal and complete chain 6 and drives the begin chain 7. Multiplexer 507 has inputs from the begin signal and complete chain 7 and drives the begin chain 8. The selection of multiplexers 502 and 506 are controlled by wake up mode[1]. The selection of multiplexers 501, 503, 505 and 507 are controlled by the logical AND from AND gate 511 of wake up mode[1] and wake up mode[0]. The selection of multiplexer 504 is controlled by the logical OR from OR gate 512 of wake up mode[1] and wake up mode[0].

The circuit of FIG. 5 operates as follows. If wake up mode is [0:0], then each of multiplexers 501, 503, 505 and 507 receives 0 (0 AND 0=0) and select the corresponding complete chain signal from the prior power switch chain. Multiplexers 502 and 506 receive 0 (wake up mode[1]=0) and select the corresponding complete chain signal from the prior power switch chain. Multiplexer 504 receives 0 (0 OR 0=1) and selects the corresponding complete chain signal from the prior power switch chain. Upon the begin signal power switch chain 1 starts. Upon the complete chain 1 signal power switch chain 2 starts. Each power switch chain thus begins when the prior power switch chain completes. This corresponds to driving the 8 power switch chains sequentially.

If wake up mode is [0:1], then each of multiplexers 501, 503, 505 and 507 receives 0 (0 AND 1=0) and select the corresponding complete chain signal from the prior power switch chain. Multiplexers 502 and 506 receive 0 (wake up mode[1]=0) and select the corresponding complete chain signal from the prior power switch chain. Multiplexer 504 receives 1(0 OR 1=1) and selects the begin signal. Upon the begin signal both power switch chains 1 and 5 start. Following one inverter chain delay, the complete chain 1 signal begins power switch chain 2 and the complete chain 5 signal begins power switch chain 6. Following a further inverter chain delay, the complete chain 2 signal begins power switch chain 3 and the complete chain 6 signal begins power switch chain 7. Following another inverter chain delay, the complete chain 3 signal begins power switch chain 4 and the complete chain 7 signal begins power switch chain 8. This corresponds to two parallel sets of four power switch chains.

If wake up mode is [1:0], then each of multiplexers 501, 503, 505 and 507 receives 0 (1 AND 0=0) and select the corresponding complete chain signal from the prior power switch chain. Multiplexers 502 and 506 receive 1 (wake up mode[1]=1) and select the begin signal. Multiplexer 504 receives 1 (1 OR 0=1) and selects the begin signal. Upon the begin signal both power switch chains 1, 3, 5 and 7 start. Following one inverter chain delay, the complete chain 1 signal begins power switch chain 2, the complete chain 3 signal begins power switch chain 4, the complete chain 5 signal begins power switch chain 6 and the complete chain 7 signal begins power switch chain 8. This corresponds to four parallel sets of two power switch chains.

If wake up mode is [1:1], then each of multiplexers 501, 503, 505 and 507 receives 0 (1 AND 1=1) and select the begin signal. Multiplexers 502 and 506 receive 1 (wake up mode [1]=1) and select the begin signal. Multiplexer 504 receives 1 (1 OR 1=1) and selects the begin signal. Upon the begin signal both power switch chains 1, 2, 3, 4, 5, 6, 7 and 8 start. This corresponds to all eight power switch chains parallel.

This invention thus permits selection of the speed of wake up for various power domains. This invention permits aggressive, fast power up under some conditions while enabling conservative, slow power up when needed. SOC power controller 301 may consider process, temperature and voltage variations in on the decision on which wake up mode to select at a particular time. The current embodiment anticipates that the current power supply condition will be the dominant factor in selecting the power supply mode.

Traditionally power switch chains have been very conservatively designed for the worst case. This prevents a large amount of noise or rate of change of current $$\left(\frac{di}{dt}\right)$$

during the wake up of a power domain. This invention provides the capability of reconfiguring the wake-up sequence of the chain will enable more efficient-faster wake-up sequences. For example, a wake up sequence can be made more aggressive (faster) if only a single power domain such as a CPU core is being powered ON as compared to powering ON multiple CPU cores in parallel. When most of the power domains in the SOC are in sleep or retention mode, longer wake-up times permissible. In that scenario the chains can be configured all in series causing the slowest wake-up. In the case of a single core waking up while the rest of the chip is fully active, the power switch chains and be configured to have a fast wake-up (because only a single IP is being awaken at once) which will minimize the delay of the CPU response. Note that only one power domain waking up does not generation a large $$\frac{di}{dt}.$$

Current solutions are static with excessive design margins to cover various process, voltage, and temperature (PVT) corners. The static nature limits the effectiveness of any dynamic power saving method one might have. This invention is dynamic and can be changed on-the-fly.

This invention enables elimination of excessive design margin based on the operating point of the SOC. This invention allows for more aggressive power management techniques which are traditionally not feasible.

What is claimed is:

1. A power supply control system for a power domain on an integrated circuit comprising:
   a power supply;
   eight power switches, each having a first terminal connected to said power supply, a second terminal connected to a power supply input of the power domain and an input for control of conduction between said first terminal and said second terminal, wherein each of said eight power switches includes
   a plurality of field effect transistors, each having a source-drain path connected between said power supply and the power supply input of the power domain and a gate, and
   an inverter chain of a plurality of inverters twice as many as said plurality of field effect transistors, each inverter having an input and an output, said input of a first inverter receiving said input of said power switch, said input of each inverter after said first inverter connected to said output of a prior inverter in said chain, said output of a last inverter in said chain generating a corresponding chain complete signal, said output of odd numbered inverters connected to said gate of a corresponding one of said field effect transistors;
   a power supply controller having a plurality of outputs, each output connected to said input of a corresponding power switch, said power supply controller operable to power up the power domain by supplying signals on said
   outputs to inputs of corresponding power switches to
   sequentially cause said power switches to conduct
   until all power switches are turned conduct, and
power up the power domain by supplying signals on said
   outputs to inputs of corresponding power switches to
   conduct via at least two power switches simultaneously;
said power supply controller includes
   a two bit mode input,
   an AND gate having a first input connected to a first bit
      of said two bit mode input, a second input connected
      to a second bit of said two bit mode input and an
      output,
   an OR gate having a first input connected to said first bit
      of said two bit mode input, a second input connected
      to said second bit of said two bit mode input and an
      output,
   a begin input receiving an external begin signal and
      connected to said input of said first inverter of a first
      power switch,
   a first multiplexer having a first input connected to said
      begin input, a second input connected to said output of
      said last inverter of said first power switch, an output
      connected to said input of said first inverter of a second power switch and a control input connected to
      said output of said AND gate,
   a second multiplexer having a first input connected to
      said begin input, a second input connected to said
      output of said last inverter of said second power
      switch, and an output connected to said input of said
      first inverter of a third power switch and a control
      input connected to said second bit of said mode input,
   a third multiplexer having a first input connected to said
      begin input, a second input connected to said output of
      said last inverter of said third power switch, and an
      output connected to said input of said first inverter of
      a fourth power switch and a control input connected to
      said output of said AND gate,
   a fourth multiplexer having a first input connected to
      said begin input, a second input connected to said
      output of said last inverter of said fourth power
      switch, and an output connected to said input of said
      first inverter of a fifth power switch and a control input
      connected to said output of said OR gate,
   a fifth multiplexer having a first input connected to said
      begin input, a second input connected to said output of
      said last inverter of said fifth power switch, and an
      output connected to said input of said first inverter of
      a sixth power switch and a control input connected to
      said output of said AND gate,
   a sixth multiplexer having a first input connected to said
      begin input, a second input connected to said output of
      said last inverter of said sixth power switch, and an
      output connected to said input of said first inverter of
      a seventh power switch and a control input connected
      to said second bit of said mode input,
   a seventh multiplexer having a first input connected to
      said begin input, a second input connected to said
      output of said last inverter of said seventh power
      switch, and an output connected to said input of said
      first inverter of an eighth power switch and a control
      input connected to said output of said AND gate.

* * * * *